Feb. 16, 1960 H. SCHARLA-NIELSEN ET AL 2,925,477
RADIO FREQUENCY AMPLIFIER
Filed Sept. 12, 1957
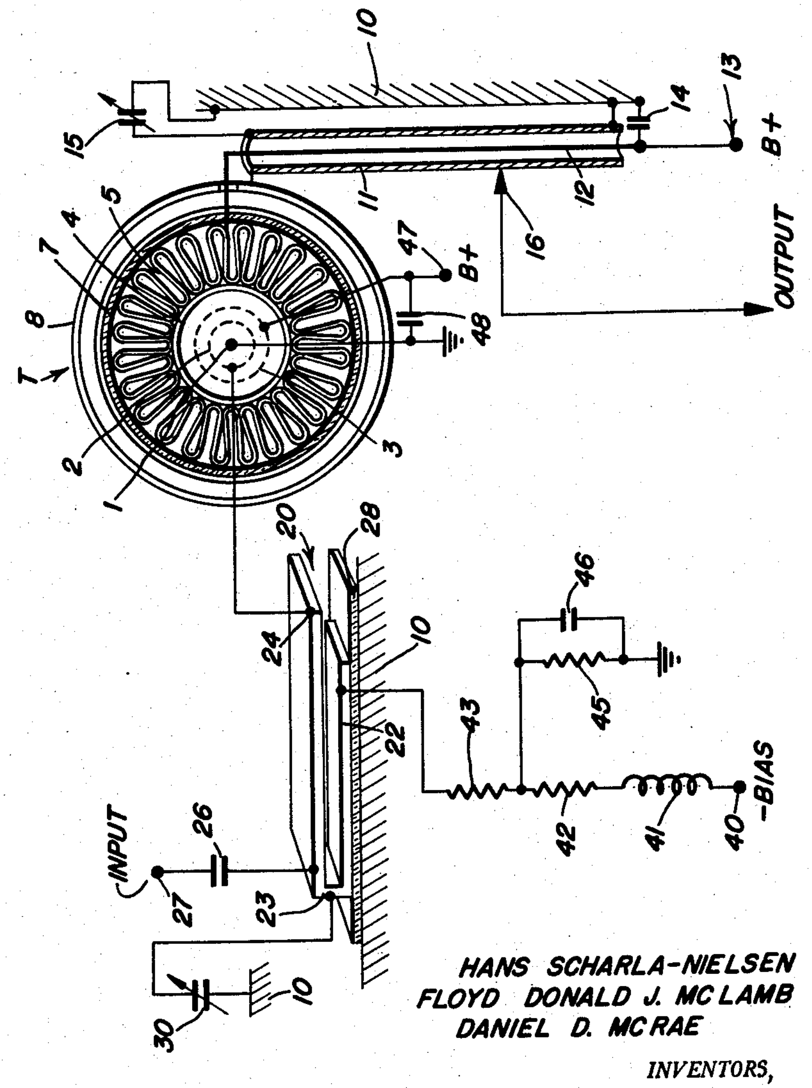
HANS SCHARLA-NIELSEN
FLOYD DONALD J. MC LAMB
DANIEL D. MCRAE
INVENTORS,
BY Hurvitz & Rose
ATTORNEYS

United States Patent Office 2,925,477

Patented Feb. 16, 1960

2,925,477

RADIO FREQUENCY AMPLIFIER

Hans Scharla-Nielsen, Indialantic, and Daniel D. McRae and Floyd Donald J. McLamb, Melbourne, Fla., assignors to Radiation, Inc., Melbourne, Fla., a corporation of Florida Application September 12, 1957, Serial No. 683,574

10 Claims. (Cl. 330—53)

The present invention relates generally to vacuum tube amplifiers, and particularly to ultra-high frequency amplifiers having novel input and output tank configurations and coupling elements.

A variety of amplifiers are known to the prior art which are capable of operating in the U.H.F. region, and specifically in the vicinity of 200 mc. In general, such amplifiers have been relatively bulky devices, of low efficiency, incapable of operation over a wide variety of environmental conditions, having relatively small output power, and small power gain.

It is a broad object of the present invention to provide a novel amplifier, tunable over a range of frequencies in the U.H.F. band, capable of operation from a driver of convenient impedance, and of relatively low power and voltage output, which shall have high power gain and efficiency, be small, ruggedized, and capable of operation under severe environmental conditions.

In one specific embodiment of an amplifier according to the present invention, 50 watts of output power is delivered by a single tube to a 50 ohm load, when driven from a two watt, 50 ohm, R.F. oscillator or transmitter. The amplifier is readily tunable over a frequency range 215 to 245 mc.

The tube type employed is a 4CX300A Eimac stacked-ceramic tetrode, which possesses the required environmental qualifications, but has the defect that tube and socket have on input capacitance of 40 $\mu\mu f$. To operate efficiently, class C operation is employed, but total driving signal available is 10 v. R.M.S., i.e., 2 watts out of a 50 ohm driver. Since far more than 10 v. of driving signal is required for class C operation, it is necessary to employ voltage step up in the input circuit. It is one feature of the present invention to provide a system for driving a high efficiency amplifier tube having relatively high input capacitance, at high level, from a low level signal source.

A further problem encountered in the pertinent art is to design an output tank for an amplifier with a sufficiently high Q to realize a high power gain, of the order of 25, which is yet capable of efficiently coupling about 50 watts of power to a 50 ohm load, the circuitry to be rugged and to be tunable over the desired frequency range. It is a further feature of the invention to provide the required output circuitry and construction.

An input tank circuit according to the present invention consists of two transmission lines, arranged so that their series combination as seen from the grid of the amplifier tube is the conjugate of the input impedance of the tube, so that the circuit resonates. One of the transmission lines is open at the grid end and shorted at the remaining end, and is driven at a point adjacent the shorted end. The other transmission line is formed of one conductor of the one line, taken with the chassis of the amplifier. The one line is shorter than $n/4\lambda$, where $\lambda$ is wavelength and $n$ is odd, and hence appears as an inductance. The other line length is selected to appear as a capacitance between one side of the one line and the chassis. Across this capacitance is connected a variable trimmer condenser. The values of capacity and inductance are selected to resonate with the tube input capacity, and the tapping point for the one line is so selected that voltage step-up occurs.

Structurally, the input tank may consist of a U-shaped metallic device, having one longer leg and one shorter leg. The base of the U provides a short at the cold end of the tank circuit, and the open end of the long leg is connected to the grid of the amplifier. The short leg is extended parallel to and is spaced from the chassis by a strip of insulation. The structure is rigid by virtue of the intimate relation between the short leg and the chassis, and may be rugged by virtue of fabrication from a solid block of metal, in which a longitudinal slot is milled.

Since the bar may be bolted solidly to the chassis while remaining electrically or conductively isolated therefrom, the structure is well suited to withstand shock and vibration, while the capacity of the bar to chassis forms a capacity which assists in tuning the input tank.

The major impedance determining element of the tank, i.e., the line formed by the long and short legs, may be made to have a very high Q, since the bar has extremely low resistance. The loading effects of the tuning capacitor and the grid bias circuitry appear across the lower line, i.e., the line formed by the shorter leg and the chassis, and hence do not affect the Q, and therefore the voltage step-up of the main or upper line.

The output tank circuit is a tuned transmission line, consisting of a metallic tube, extending parallel with the chassis of the system and a short distance therefrom, so as to form therewith a capacitively loaded ¼ wave line. The tube is coupled to the amplifier tube by means of a capacitor, which consists of a Teflon strip or sheet wrapped around the anode radiator of the tube, and of a metallic clamp wrapped around the Teflon strip or sheet.

The anode supply line may consist of a lead extending interiorly of the output tank tube. Thereby the lead and tube constitute an effective choke for R.F. Since the output tank tube may be at D.C. ground potential, output power may be derived by a tap to the tube at a point selected to provide suitable output impedance. The output tank tube may be shunted by a variable tuning capacitor, connected between the anode coupling capacitor and the chassis. This tuning capacitor is not subjected to D.C. voltage, and hence need have only sufficient rating to withstand the R.F. voltage to the output tank.

It is, accordingly, a broad object of the present invention to provide a novel radio frequency amplifier, having high power gain and high efficiency, of convenient input impedance, and capable of driving an output load of convenient impedance.

It is a further object of the invention to provide a novel vacuum tube amplifier having a tuned transmission line input tank and a tuned transmission line output tank, the input tank resonating with the input capacity of the vacuum tube and the output tank being employed to provide R.F. power at zero D.C. level, and as an isolating element for a D.C. plate power lead.

Still another object of the invention resides in the provision of a novel input tank circuit for an amplifier, capable of withstanding shock and vibration, and including a high Q element and a capacitive element in a unitary structure.

It is still another object of the invention to provide an output tank circuit, having a novel coupling arrangement to a vacuum tube anode, and provision for supplying D.C. voltage to the anode, the tank circuit including a metallic tube within which extends a D.C. power lead, said lead being bypassed at both ends to said tube such that it represents an R.F. choke to shunt feed D.C. to the vacuum tube anode.

The above and still further objects, features and advantages of the present invention will become apparent upon consideration of the following detailed description of one specific embodiment thereof, especially when taken in conjunction with the accompanying drawings, wherein:

The single figure of the drawings is a representation, partly schematic and partly structural of an amplifier according to the present invention.

Referring now more particularly to the accompanying drawings, the reference letter T denotes a tetrode vacuum tube, preferably of the 4CX300A Eimac stacked-ceramic type, although other tube types may be employed within the scope of the invention. The tetrode T includes a cathode 1, a control grid 2, a screen grid 3, an anode 4 and a heat radiator 5, which is of metallic structure and is secured electrically and physically at multiple points about the anode 5, the anode and the radiator being cylindrical in shape.

Surrounding the radiator 5 is a layer 7 of Teflon or the like, which constitutes a suitable low loss insulating medium for a clamp 8, in the form of a ring surrounding the radiator 5 and insulated therefrom for D.C. The radiator 5, the layer of Teflon or the like 7, and the clamp 8 form a capacitor for coupling an external tank circuit to the anode 4.

The numeral 10 denotes the chassis of an amplifier structure. Extending adjacent and parallel thereto is a metallic tube 11, the length of which, in relation to its spacing from chassis 10 established a parallel resonant circuit, in the form of a capacitively loaded quarter wave transmission line shorted at one end.

An anode power lead 12 extends internally of the tube 11, from a power terminal 13 to anode 5, in insulated relation to the tube 11. The latter is connected at one end to the clamp 8, by a short lead L, and is thereby capacitively coupled to the anode 4. The terminal 13 may be by-passed to ground for R.F. by a fixed condenser 14, and the tube 11 may be shunted to ground by a variable tuning capacitor 15, which serves to vary the resonant frequency of the output tank circuit over a small range of values.

Since the tube 11 is D.C. isolated from the anode, the tuning capacitor 15 need only be designed for withstanding R.F. voltage, and not R.F. superposed on D.C. The lead 12 in conjunction with the tube 11 provide a concentric line R.F. shorted at both ends.

Output power referenced to the chassis potential may be derived from the outside of tube 11, by means of a tap 16, and a conductive lead, since tube 11 is D.C. connected to the chassis. Moreover, the tap point may be selected to provide an impedance match to a 50 ohm or other desired load, since the tube 11 and the tap 16 act as an impedance step-down transformer, while the tube itself is seen from the tube anode as a high impedance equivalent to a parallel resonant circuit.

The tube 11 may be bent into semi-circular, or circular form, or otherwise as desired, to conserve space.

The input tank circuit consists of a U-shaped bar 20, which may be machined from a solid block of metal. The U-shaped bar 20 includes a relatively long leg 21, a relatively short leg 22 extending parallel to the long leg 21, and a base 23 joining the legs at an end. The bar then constitutes a parallel conductor transmission line open at one end, and shorted by the base 23 at the other end.

The open end 24 of the long leg 21 is directly connected to the grid 2, while a point 25 of the long leg 21, adjacent to but not at the base 23, is coupled by a capacitor 26 to a signal input terminal 27.

The short leg 22 is firmly secured to the chassis 10 mechanically, extending parallel thereto, but is electrically insulated therefrom by a layer 28 of Teflon, or other low loss insulating material. The lower leg 22 taken with the chassis provides then, a capacity, by virtue of its length and its spacing from the chassis. Present is both fixed capacity and capacity by virtue of transmission line properties of the leg and chassis. Moreover, a tunable capacity 30 is connected between base 23 and chassis 10, to permit variation of the effective capacity of the short leg to chassis circuit.

The input circuit of the vacuum tube possesses inherent capacity. For the preferred tube type this value is about 40 $\mu\mu$f. The overall lengths of the input tank lines, i.e., legs 21 and 22, and their spacings and characteristic impedances, are selected to resonate with the tube input capacity, the leg 21 being for this purpose shorter than $\frac{1}{4}\lambda$, where $\lambda$ is the operating wave length, and hence appearing as an effective inductance.

The transmission line 20 represents an extremely high Q circuit, because fabricated of thick low resistivity metal, and because lacking in loading of any type. It follows that a tremendous gain in R.F. voltage appears, as between tap 25 and grid 2. It has been found, in practice, that two watts can be supplied from a 50 ohm source, at terminal 27, and that this power is sufficient to develop adequate R.F. driving voltage at the grid of the amplifier despite the fact that the amplifier is operating class C, or nearly class C, in order to obtain high efficiency of power conversion on the output circuit. In effect the control grid of the tetrode 1 sees an impedance conjugate to its own impedance, when looking into the line 20, and hence forms part of a series resonant network, which permits high R.F. driving current to flow. At the same time the input terminal 27 sees 50 ohms by virtue of the tap point 25, and the line 20 provides a high voltage at the grid because it is open at the grid end and is a high Q line. An impedance match exists both between the driving source and the tank circuit, and between the tank circuit and the tube input circuit, accordingly, accompanied by a voltage step-up at the tube input circuit. Fixed bias for the control grid is provided from a negative voltage terminal 40, which is connected via choke 41, and two series connected resistances 42, 43 to the base 23. In addition, a parallel resistance 45 and condenser 46 is connected from the junction of resistances 42, 43 to ground. The latter element provides grid leak bias, and is suitably designed for that purpose. The fixed bias may be removed when the amplifier is in operation, but is required while anode and screen voltages are applied without concurrent application of R.F. drive voltage.

The screen grid 3 is connected directly to a B+ voltage terminal 47, and is by-passed to ground by a condenser 48, which in a preferred embodiment of the invention may be built into the socket of the tube 1.

The two transmission line tank circuits, i.e., the input tank and the output tank, may be physically located on opposite sides of a chassis wall, to reduce coupling therebetween.

While the system of the invention has been disclosed as an amplifier, the structure and circuitry are equally adapted to utilization as an oscillator, by coupling the output lead to the input lead in proper phase, and may be employed as a modulated amplifier, as by varying the anode voltage in response to a signal.

While we have described and illustrated one specific embodiment of our invention, it will be clear that variations of the details of construction which are specifically illustrated and described may be resorted to without departing from the true spirit and scope of the invention as defined in the appended claims.

What is claimed is:

1. A tank circuit comprising a metallic chassis at ground potential, a U-shaped metallic structure having a relatively long arm, a relatively short arm parallel with and spaced from said long arm and a short circuiting element joining said arms only at adjacent ends thereof, the remaining end of said long arm being open, an insulating sheet located between said short arm and said metallic chassis and means mechanically and insulatedly securing said short arm to said chassis, connections for applying driving signal between said short-circuiting element and an intermediate point of said long arm, and connections for deriving output signal between said metallic chassis and the open end of said relatively long arm.

2. The combination according to claim 1, wherein said relatively long arm is inductive by virtue of its length and its proximity to said relatively short arm and the presence of said short circuiting element, at an operating frequency of said tank circuit, and wherein said short arm and said metallic chassis provide a capacitance at said operating frequency by virtue of the length of said relatively short arm and its insulated relation to said chassis.

3. In combination, a vacuum tube amplifier having an operating frequency, said tube having a grid and a cathode, the grid and cathode displaying predetermined capacitance therebetween, a two conductor transmission line open at one end and short circuited at the other, an extensive metallic structure, one of said two conductors being proximately spaced from said extensive metallic structure along its length by an insulating strip and providing distributed capacity by virtue of the proximate spacing and its length, a connection from said grid to a point adjacent the open end of said transmission line at the other of said conductors, a driving circuit coupled to the other of said conductors intermediate the ends of said transmission line, said two conductor transmission line having an electrical length such that it is effectively an inductance, said inductance and capacity arranged and selected to have a net inductance in series which resonates with the predetermined capacitance at said operating frequency.

4. The combination according to claim 3 wherein is provided a variable trimmer condenser for varying said capacity, said trimmer capacity being connected across said capacity.

5. The combination according to claim 4 wherein the point of coupling of said trimmer condenser is immediately adjacent the shorted end of said transmission line.

6. A class C amplifier operable from a 2 watt, 50 ohm driver at a wavelength $\lambda$, including a vacuum amplifier tube, said vacuum tube having an effective input capacitance of approximately 40 $\mu$f, a series tuned circuit including said capacitance as a series element of said tuned circuit, a distributed inductive reactance in series with a distributed capacitive reactance as another element of said tuned circuit, said inductive reactance and capacitive reactance in series having a net inductive reactance and means connecting said driver across a portion of said first mentioned inductive reactance such that voltage step-up occurs by virtue of auto-transformer action in said first mentioned inductive reactance, said tuned circuit being series tuned to said wavelength $\lambda$ and having a relatively high Q, whereby a far higher voltage appears across said capacitance than is available from said driver.

7. The combination according to claim 6 wherein said portion of said inductive reactance is selected to provide a substantial impedance match with said driver.

8. The combination according to claim 7 wherein said inductive reactance is connected with an auxiliary tuning capacitance.

9. The combination according to claim 7 wherein said inductive reactance includes a section of transmission line having a length less than $\lambda/4$ an open output end and its remaining end short-circuited, said open output end being connected to said input capacitance.

10. A vacuum tube circuit operating at a predetermined frequency including a vacuum tube having an anode, a control grid, and a cathode, means connecting said cathode to a point of reference potential, a grid tank circuit comprising a transmission line open at one end and including a first conductor, a second conductor extending substantially parallel to said first conductor, a short circuit between two adjacent ends of said first and second conductors, a third grounded extensive conductor extending parallel to and adjacent to and insulated from said second conductor at least along the entire length of the latter, the grid to cathode circuit of said vacuum tube having substantial inherent capacity, said first and second conductors constituting an inductance by virtue of their length at said predetermined frequency and said short circuit, said second and third conductors constituting a capacity by virtue of their lengths and their insulated relation, said inductance and capacity providing a net inductance resonating with said substantial inherent capacity at said predetermined frequency, the unshorted end of said first conductor being connected directly to said control grid, wherein is provided an input driving terminal, and means coupling said input driving terminal to a point of said first conductor more nearly adjacent to said short circuit than to the open end of said first conductor.

References Cited in the file of this patent

UNITED STATES PATENTS

| | | |
|---|---|---|
| 2,090,513 | Farnham | Aug. 17, 1937 |
| 2,228,862 | Wessels | Jan. 14, 1941 |
| 2,272,851 | Ramsey | Feb. 10, 1942 |
| 2,278,238 | Buschbeck | Mar. 31, 1942 |
| 2,421,784 | Haeseler et al. | June 10, 1947 |
| 2,463,724 | Starner | Mar. 8, 1949 |
| 2,481,456 | Tyzzer | Sept. 6, 1949 |
| 2,554,457 | Dome | May 22, 1951 |
| 2,562,921 | Kandoian | Aug. 7, 1951 |
| 2,665,339 | Leng | Jan. 5, 1954 |
| 2,717,363 | Hubbard | Sept. 6, 1955 |
| 2,748,286 | Bussard | May 29, 1956 |
| 2,763,843 | Cushman | Sept. 18, 1956 |
| 2,765,444 | Green | Oct. 2, 1956 |
| 2,766,383 | Hubbard | Oct. 9, 1956 |
| 2,772,355 | Deutsch et al. | Nov. 27, 1956 |

FOREIGN PATENTS

| | | |
|---|---|---|
| 747,904 | Germany | Oct. 20, 1944 |